US012305986B2

(12) United States Patent
Granata

(10) Patent No.: US 12,305,986 B2
(45) Date of Patent: May 20, 2025

(54) CONTROL CIRCUIT OF A MEMS GYROSCOPE, MEMS GYROSCOPE AND CONTROL METHOD

(71) Applicant: STMICROELECTRONICS S.r.l., Agrate Brianza (IT)

(72) Inventor: Angelo Granata, Syracuse (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 346 days.

(21) Appl. No.: 17/899,478

(22) Filed: Aug. 30, 2022

(65) Prior Publication Data

US 2023/0102160 A1    Mar. 30, 2023

(30) Foreign Application Priority Data

Sep. 27, 2021    (IT) .................. 102021000024644

(51) Int. Cl.
*G01C 19/5776*    (2012.01)
*G01C 19/5712*    (2012.01)
*H03M 3/00*    (2006.01)

(52) U.S. Cl.
CPC ..... *G01C 19/5712* (2013.01); *G01C 19/5776* (2013.01); *H03M 3/344* (2013.01); *H03M 3/40* (2013.01)

(58) Field of Classification Search
CPC ........... G01C 19/5712; G01C 19/5776; H03M 3/344; H03M 3/40
See application file for complete search history.

(56) References Cited

U.S. PATENT DOCUMENTS 5,481,914 A    1/1996  Ward
6,111,531 A *  8/2000  Farag .................. H03M 3/40
                                          341/143

(Continued)

FOREIGN PATENT DOCUMENTS

EP    2259019 A1    12/2010

OTHER PUBLICATIONS

Chen et al., "Electromechanical Sigma-Delta Modulators (ΣΔM) Force Feedback Interfaces for Capacitive MEMS Inertial Sensors: A Review," *IEEE Sensors Journal* 16(17):6476-6495, Sep. 1, 2016.

(Continued)

*Primary Examiner* — David J Bolduc
(74) *Attorney, Agent, or Firm* — Seed IP Law Group LLP

(57) ABSTRACT

The control circuit for a MEMS gyroscope is configured to receive a measurement signal which has a quadrature component and a sensing component. The control circuit has: an input stage which acquires an input signal, generating an acquisition signal, where the input signal is a function of the measurement signal and of a quadrature cancellation signal; a processing stage which extracts a first component of the acquisition signal, indicative of the sensing component of the measurement signal and having a sensing frequency band; and a quadrature correction stage which extracts a second component of the acquisition signal, indicative of the quadrature component of the measurement signal, and generates the quadrature cancellation signal from a reference signal. The quadrature cancellation signal is a signal modulated as a function of the second component of the acquisition signal, at an update frequency which is outside the sensing frequency band.

20 Claims, 4 Drawing Sheets

(56) References Cited

U.S. PATENT DOCUMENTS

| | | | |
|---|---|---|---|
| 6,230,563 B1 | 5/2001 | Clark et al. | |
| 6,250,156 B1 | 6/2001 | Seshia et al. | |
| 6,356,594 B1* | 3/2002 | Clement | H03M 3/40 |
| | | | 375/269 |
| 6,845,669 B2 | 1/2005 | Acar et al. | |
| 6,860,150 B2 | 3/2005 | Cho | |
| 6,860,151 B2 | 3/2005 | Platt et al. | |
| 7,043,987 B2 | 5/2006 | Jeong et al. | |
| 7,051,590 B1 | 5/2006 | Lemkin et al. | |
| 7,240,533 B2 | 7/2007 | Fell et al. | |
| 7,305,880 B2 | 12/2007 | Caminada et al. | |
| 7,443,324 B1* | 10/2008 | Muhammad | H03M 3/332 |
| | | | 341/131 |
| 8,037,757 B2 | 10/2011 | Johnson | |
| 8,096,179 B2 | 1/2012 | Bien et al. | |
| 8,443,665 B2 | 5/2013 | Hsu | |
| 8,667,842 B2 | 3/2014 | Prandi | |
| 8,857,259 B2 | 10/2014 | Hsu et al. | |
| 9,212,910 B2 | 12/2015 | Donadel et al. | |
| 9,329,042 B1* | 5/2016 | Cazzaniga | G01C 19/5776 |
| 9,379,733 B1* | 6/2016 | Lee | H03M 3/30 |
| 11,251,807 B1* | 2/2022 | Ren | H03M 3/458 |
| 2003/0101814 A1 | 6/2003 | Challoner et al. | |
| 2006/0162448 A1 | 7/2006 | Durante et al. | |
| 2007/0163815 A1 | 7/2007 | Ungaretti et al. | |
| 2007/0180908 A1 | 8/2007 | Seeger et al. | |
| 2008/0000296 A1 | 1/2008 | Johnson | |
| 2008/0025437 A1* | 1/2008 | Huynh | H04L 27/3881 |
| | | | 329/304 |
| 2008/0282833 A1 | 11/2008 | Chaumet | |
| 2009/0031805 A1 | 2/2009 | Mayer-Wegelin et al. | |
| 2009/0183567 A1* | 7/2009 | Fukushima | G06F 3/038 |
| | | | 73/504.02 |
| 2009/0241662 A1 | 10/2009 | Supino et al. | |
| 2010/0000289 A1 | 1/2010 | Prandi et al. | |
| 2010/0263445 A1 | 10/2010 | Hayner et al. | |
| 2010/0307243 A1 | 12/2010 | Prandi et al. | |
| 2011/0187566 A1* | 8/2011 | Soenen | H03M 3/00 |
| | | | 341/110 |
| 2011/0192226 A1* | 8/2011 | Hayner | G01C 19/5776 |
| | | | 73/504.12 |
| 2011/0197675 A1 | 8/2011 | Caminada et al. | |
| 2012/0167680 A1* | 7/2012 | Hwang | G01C 19/5776 |
| | | | 73/504.12 |
| 2012/0186345 A1 | 7/2012 | Bauer et al. | |
| 2012/0232847 A1* | 9/2012 | Horton | G01C 21/166 |
| | | | 702/189 |
| 2013/0031950 A1* | 2/2013 | Donadel | G01C 19/5776 |
| | | | 73/1.77 |
| 2013/0197858 A1* | 8/2013 | Egretzberger | G01C 19/5712 |
| | | | 702/145 |
| 2013/0268228 A1 | 10/2013 | Opris et al. | |
| 2013/0341737 A1 | 12/2013 | Bryzek et al. | |
| 2014/0007681 A1 | 1/2014 | Lin | |
| 2014/0060185 A1* | 3/2014 | Rombach | G01C 19/56 |
| | | | 73/504.12 |
| 2014/0132186 A1 | 5/2014 | Tazartes | |
| 2014/0190258 A1 | 7/2014 | Donadel et al. | |
| 2014/0290361 A1* | 10/2014 | Kim | G01C 19/5776 |
| | | | 73/504.12 |
| 2014/0300425 A1 | 10/2014 | Cazzaniga et al. | |
| 2015/0276407 A1 | 10/2015 | Bhandari | |
| 2015/0316667 A1* | 11/2015 | Projetti | G01V 1/164 |
| | | | 73/514.02 |
| 2016/0028380 A1* | 1/2016 | Townsend | H03B 1/18 |
| | | | 327/172 |
| 2016/0102979 A1* | 4/2016 | Beaulaton | G01C 19/5776 |
| | | | 318/116 |
| 2016/0269011 A1* | 9/2016 | Uehara | G01P 15/09 |
| 2017/0328712 A1* | 11/2017 | Collin | H03M 3/458 |
| 2019/0145773 A1* | 5/2019 | Collin | G01C 19/5776 |
| | | | 73/504.12 |
| 2020/0278205 A1 | 9/2020 | Kraver | |
| 2021/0305997 A1* | 9/2021 | Motz | H03M 3/506 |
| 2022/0074746 A1* | 3/2022 | Diazzi | G01C 19/5776 |
| 2022/0364863 A1* | 11/2022 | Greep | G01C 19/5776 |
| 2022/0373574 A1* | 11/2022 | Aaltonen | G01C 19/5776 |
| 2023/0378974 A1* | 11/2023 | Rajaee | H03M 3/422 |

OTHER PUBLICATIONS

Antonello et al., "Open loop Compensation of the Quadrature Error in MEMS Vibrating Gyroscopes," *35th Annual Conference of IEEE Industrial Electronics*, pp. 4034-4039, Nov. 3-5, 2009.

* cited by examiner

CONTROL CIRCUIT OF A MEMS GYROSCOPE, MEMS GYROSCOPE AND CONTROL METHOD

BACKGROUND

Technical Field

The present disclosure relates to a control circuit of a MEMS gyroscope, to a MEMS gyroscope and to a control method.

Description of the Related Art

A gyroscope made using MEMS ("Micro Electro-Mechanical Systems") technology is formed in one or more dice of semiconductor material, for example silicon, wherein an oscillating system, a driving circuit and a sensing circuit, mutually coupled, are formed.

The oscillating system is formed by one or more movable masses suspended on a substrate and free to oscillate with respect to the substrate with one or more degrees of freedom. The oscillating system further comprises a driving structure, coupled to the driving circuit and configured to cause an oscillation of the one or more movable masses along a driving direction, and a sensing structure, coupled to the sensing circuit and configured to sense a movement of the one or more movable masses along a sensing direction perpendicular to the driving direction.

In some MEMS gyroscopes, driving and sensing may be based on different operating principles, e.g., electromagnetic, piezoelectric or capacitive.

When the MEMS gyroscope rotates with an angular velocity about a rotation axis, a movable mass that oscillates with a linear velocity along a direction perpendicular to the rotation axis is subject to a Coriolis force directed along a direction perpendicular to the rotation axis and to the direction of the linear velocity.

In use, the driving circuit provides a driving signal, for example a voltage in case of capacitive driving, to the driving structure, causing an oscillation of the oscillating structure along the driving direction.

The sensing structure senses a movement of the oscillating system along the sensing direction and provides a corresponding sensing signal to the sensing circuit.

In some MEMS gyroscopes, due to variability and imperfections associated with the manufacturing process of the MEMS gyroscope, the driving signal may generate a spurious movement of the one or more movable masses along the sensing direction, even in the absence of a rotation of the MEMS gyroscope. The spurious movement is sensed by the sensing structure, thus generating a spurious signal, known as a quadrature error, which adds to the sensing signal originating from the rotation of the MEMS gyroscope.

This reduces the sensitivity of the MEMS gyroscope.

In order to reduce the contribution of the quadrature error on the sensing signal, a sensing circuit may comprise a trimming circuit which generates a correction signal configured to cancel the spurious quadrature signal. However, the correction signal value is set during an initial calibration step of the MEMS gyroscope. As a result, this approach does not allow any variations in the spurious quadrature signal to be corrected while using the MEMS gyroscope.

The trimming circuit may be recalibrated multiple times during the life cycle of the MEMS gyroscope. However, this recalibration introduces noise into the MEMS gyroscope output signal, thereby compromising the sensing performances thereof.

BRIEF SUMMARY

The technical solutions of the present disclosure overcome the disadvantages of the prior art.

According to the present disclosure a control circuit of a MEMS gyroscope, a MEMS gyroscope and a control method are therefore provided.

BRIEF DESCRIPTION OF THE SEVERAL VIEWS OF THE DRAWINGS

For a better understanding of the present disclosure, some embodiments thereof are now described, purely by way of non-limiting example, with reference to the attached drawings, wherein.

DETAILED DESCRIPTION

Figure 1:
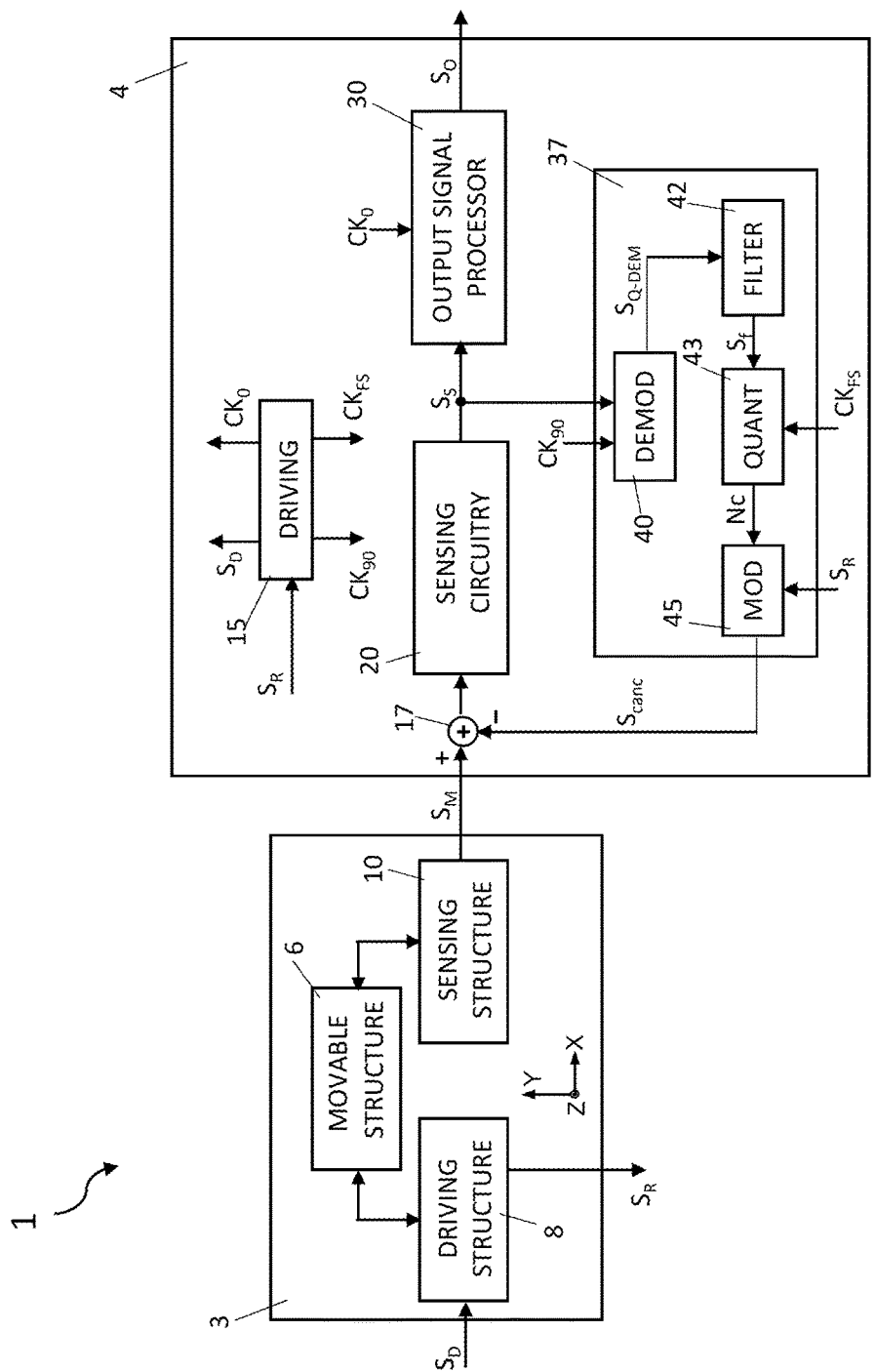
FIG. 1 shows a block diagram of the present MEMS gyroscope, according to an embodiment.
Figure 2:
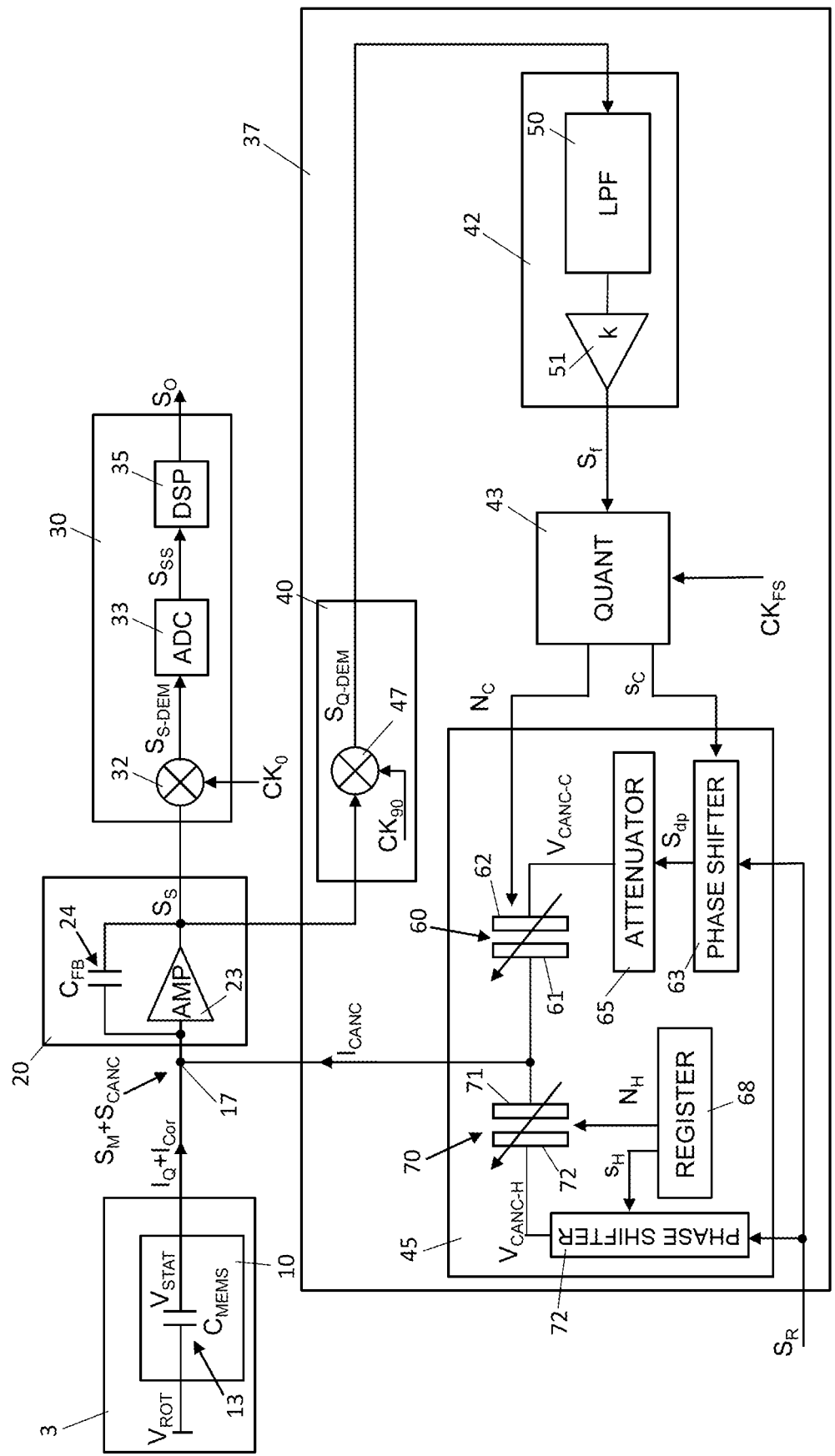
FIG. 2 shows a detailed block diagram of the MEMS gyroscope of FIG. 1.

FIGS. 1 and 2 show a MEMS gyroscope 1 comprising an oscillating system 3 and a control circuit 4, which are operatively coupled.

The oscillating system 3 and the control circuit 4 may be formed in a single die of semiconductor material, e.g., silicon, or in separate dice.

The oscillating system 3 is made using MEMS technology and comprises a movable and/or deformable structure, hereinafter referred to as movable structure 6, having a resonance frequency $f_r$, a driving structure 8 and a sensing structure 10, mutually coupled.

The driving structure 8 is configured to receive a driving signal $S_D$ from the control circuit 4 and cause a movement, for example, an oscillation, of the movable structure 6 along a driving direction, using an actuation principle, e.g., of electromagnetic, piezoelectric or electrostatic type.

For example, considering a Cartesian reference system XYZ comprising a first axis X, a second axis Y and a third axis Z, the driving direction may be parallel to the first axis X.

Furthermore, in this embodiment, the driving structure 8 generates a position signal $S_R$, indicative of a movement of the movable structure 6 along the driving direction, and provides the position signal $S_R$ to the control circuit 4.

For example, if the driving signal $S_D$ causes an oscillation of the movable mass 6 at the resonance frequency $f_r$, then the position signal $S_R$ is a periodic signal, for example, sinusoidal, having the resonance frequency $f_r$ and whose amplitude is a function of the position variation of the movable structure 6.

The position signal $S_R$ may be generated using a sensing principle of capacitive, piezoelectric, piezoresistive or electromagnetic type, according to the specific application.

The sensing structure 10 is configured to sense a movement of the movable structure 6 along a sensing direction, for example perpendicular to the driving direction, for example parallel to the second axis Y, and generate a corresponding measurement signal $S_M$, which is provided to the control circuit 4.

In this embodiment, as shown in FIG. 2, the sensing structure 10 operates according to a capacitive sensing principle and is formed by a sensing capacitor 13 having, at rest, a capacitance $C_{MEMS}$.

However, the sensing structure 10 may generate the measurement signal $S_M$ using a different sensing principle, e.g., of electromagnetic or piezoelectric type.

Here, the sensing capacitor 13 is schematically represented by a parallel plate capacitor; however, the sensing capacitor 13 may be of different type, e.g., an interdigitated capacitor.

The sensing capacitor 13 has a first terminal at a rotor voltage $V_{ROT}$, which may be applied by the control circuit 4, and a second terminal at a stator voltage $V_{STAT}$ forming the measurement signal $S_M$.

For example, the rotor voltage $V_{ROT}$ is a DC voltage that allows to set a desired initial value of the potential difference of the sensing capacitor 13, useful in specific applications, e.g., to tune the sensing sensitivity of the sensing capacitor 13.

The control circuit 4 provides the driving signal $S_D$ to the oscillating system 3 and receives the measurement signal $S_M$ from the oscillating system 3.

In this embodiment, the control circuit 4 also receives the position signal $S_R$ from the oscillating system 3.

Furthermore, the control circuit 4 generates, from the measurement signal $S_M$, an output signal $S_O$, of digital type, having an output data rate (or frequency) $f_o$, for example comprised between 10 Hz and 10 kHz.

In detail, the control circuit 4 comprises a driving module 15 which receives the position signal $S_R$.

The driving module 15 generates the driving signal $S_D$, having a driving frequency $f_D$, e.g., a voltage having sinusoidal behavior over time, a sequence of pulses or a square wave, and provides the driving signal $S_D$ to the driving structure 8, for the actuation of the movable structure 6.

The driving frequency $f_D$ may be chosen, at the design step, as a function of the electrical and/or mechanical characteristics of the oscillating system 3, e.g., as a function of the resonance frequency $f_r$ of the movable structure 6, and of the control circuit 4.

The driving module 15 may adjust the driving signal $S_D$, e.g., it may adjust the amplitude thereof in case of sinusoidal signal or the duty cycle in case of square wave, so that the movement of the movable structure 6 follows a desired profile over time, e.g., has a desired oscillation amplitude, which may be chosen at the design step.

In this regard, the driving module 15 may adjust the driving signal $S_D$ as a function of the position signal $S_R$, for example by comparing the position signal $S_R$ with one or more values indicative of the desired movement profile of the movable structure 6.

Again with reference to FIG. 1, the driving module 15 also generates an in-phase clock signal $CK_0$ and an out-of-phase clock signal $CK_{90}$, for example two periodic square wave signals, which have the driving frequency $f_D$ and are mutually phase-shifted, for example, phase-shifted by 90°.

The in-phase clock signal $CK_0$ and the out-of-phase clock signal $CK_{90}$ are, as a first approximation, except for latencies introduced by the driving module 15, in quadrature and, respectively, in-phase with respect to the position signal $S_R$.

In detail, the rising (or falling) edges of the in-phase clock signal $CK_0$ are synchronized with the peaks (or valleys) of the position signal $S_R$.

The rising and falling edges of the out-of-phase clock signal $CK_{90}$ are synchronized with the zero crossings of the position signal $S_R$.

Furthermore, since, as a first approximation, the position signal $S_R$ is at the driving frequency $f_D$ and is phase-shifted by 90° with respect to the driving signal $S_D$, the in-phase clock signal $CK_0$ and the out-of-phase clock signal $CK_{90}$ are in-phase and, respectively, in quadrature, with respect to the driving signal $S_D$.

The driving module 15 also generates a correction clock signal $CK_{FS}$, e.g., a periodic square wave signal, having a frequency $f_{FS}$ outside a frequency band of interest BW of the MEMS gyroscope 1, for example greater than the output frequency $f_o$ of the output signal $S_O$, as described in detail hereinbelow.

Furthermore, the frequency $f_{FS}$ of the correction clock signal $CK_{FS}$ may be equal to or different from the driving frequency $f_D$, e.g., greater than the driving frequency $f_D$, for example equal to double the driving frequency $f_D$.

According to an embodiment, the rising (or falling) edges of the correction clock signal $CK_{FS}$ are synchronized with the zero crossings of the position signal $S_R$. This is useful when using the MEMS gyroscope 1, as described herein.

In some embodiments, as also discussed herein, the control circuit 4 uses the position signal $S_R$ as a reference signal.

The control circuit 4 has an input adder node 17 receiving the measurement signal $S_M$ and a cancellation signal $S_{CANC}$, and a sensing circuitry 20, coupled to the output of the input adder node 17 and configured to provide a sensing signal $S_S$.

In operation, the sensing circuitry 20 receives a combined signal $S_M+S_{CANC}$ given by the superimposition of the measurement signal $S_M$ and the cancellation signal $S_{CANC}$.

In some embodiments, as shown in FIG. 2, the sensing circuitry 20 comprises an amplifier 23 and a feedback capacitor 24 having capacitance $C_{FB}$ and coupled between input and output of the amplifier 23.

Furthermore, in some embodiments, the input of the amplifier 23 is directly coupled to the second terminal of the sensing capacitor 13, i.e., to the stator voltage $V_{STAT}$, through the input adder node 17 and the output of the amplifier 23 provides the sensing signal $S_S$.

The control circuit 4 comprises a signal processing module 30, which receives the sensing signal $S_S$ and the in-phase clock signal $CK_0$ and provides the output signal $S_O$.

In detail, the signal processing module 30 comprises a demodulator 32 and an analog-to-digital converter 33.

The demodulator 32 receives the sensing signal $S_S$ and the in-phase clock signal $CK_0$ and provides a demodulated sensing signal $S_{S-DEM}$.

The demodulated sensing signal $S_{S-DEM}$ is formed by a component of the sensing signal $S_S$ which is in quadrature with the position signal $S_R$ (and therefore in-phase with the driving signal $S_D$) and indicative of a movement of the movable mass 6 caused by a rotation of the MEMS gyroscope 1.

The demodulated sensing signal $S_{S-DEM}$ comprises the frequency band of interest BW, comprised between a minimum frequency, e.g., between 0 Hz and 50 Hz, and a maximum frequency, e.g., comprised between 100 Hz and 10 kHz.

The frequency band of interest BW is used to determine the rotation extent of the MEMS gyroscope 1, for example a rotation angular velocity, and may be chosen during the design step as a function of the electrical and mechanical characteristics of the oscillating system 3, for example of the movable structure 6 and of the sensing structure 10, and of the electrical characteristics of the signal processing module 30.

The analog-to-digital converter 33 receives the demodulated sensing signal $S_{S\text{-}DEM}$ and discretizes it using a sampling frequency $f_{SS}$, generating a discretized signal SSS.

The sampling frequency $f_{SS}$ may be chosen at the design step as a function of the frequency band of interest BW, according to the specific application.

The sampling frequency $f_{SS}$ may be lower than or equal to a maximum value that may be chosen as a function of the frequency band of interest BW, for example equal to double the maximum frequency of the frequency band of interest BW.

The analog-to-digital converter 33 may further comprise amplifiers and/or filters configured to condition the demodulated sensing signal $S_{S\text{-}DEM}$ before its discretization, according to the specific application.

Furthermore, in this embodiment, the signal processing module 30 also comprises a digital processor 35 configured to perform further processing of the discretized signal SSS such as for example filtering and gain of the discretized signal $S_{SS}$, generating the output signal $S_O$.

Furthermore, the digital processor 35 may be configured to modify the sample rate of the discretized signal $S_{SS}$. In detail, the output frequency $f_o$ may be different, for example lower than or equal to the sampling frequency $f_{SS}$ of the discretized signal $S_{SS}$.

The control circuit 4 further comprises a correction module 37 which operates as a quantization-noise shaper and generates the correction signal $S_{canc}$, as described hereinbelow.

In some embodiments, the correction module 37 comprises a quadrature demodulator 40, a filtering stage 42, a quantizer 43 and a correction modulator 45, mutually coupled.

In some embodiments, the correction module 37 is a sigma-delta modulator.

The quadrature demodulator 40 comprises a demodulator 47 which receives the sensing signal $S_S$ and the out-of-phase clock signal $CK_{90}$ at input and provides a demodulated quadrature signal $S_{Q\text{-}DEM}$.

The demodulated quadrature signal $S_{Q\text{-}DEM}$ is formed by a component of the sensing signal $S_S$ which is in-phase with the position signal $S_R$, and therefore in quadrature with respect to the driving signal $S_D$.

The filtering stage 42 has a cut-off frequency, receives the demodulated quadrature signal $S_{Q\text{-}DEM}$ and generates a filtered signal $S_f$.

The cut-off frequency of the filtering stage 42 may be chosen at the design step, according to the specific application.

For example, the cut-off frequency of the filtering stage 42 is chosen as a function of the frequency band of interest BW and/or of the sampling frequency $f_{SS}$, e.g., may be equal to the maximum frequency of the frequency band of interest BW.

In some embodiments, the filtering stage 42 comprises a low-pass filter 50, receiving the demodulated quadrature signal $S_{Q\text{-}DEM}$, and an amplifier 51 having a gain $k$, coupled to an output of the low-pass filter 50 and configured to provide the filtered signal $S_f$.

Figure 3:
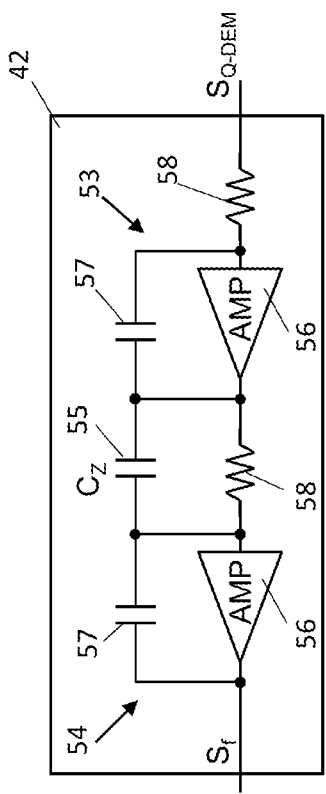
FIG. 3 shows a circuit diagram of a portion of the MEMS gyroscope of FIG. 2.

FIG. 3 shows in detail the circuit diagram of an embodiment of the filtering stage 42, here formed by an RC-type active circuit of the second order. For example, the filtering stage 42 comprises two RC filtering stages 53, 54 mutually cascade-coupled through a capacitor 55 of capacitance $C_Z$, where each RC filtering stage comprises a respective amplifier 56, a capacitor 57 and a resistor 58.

However, the filtering stage 42 may be of an order N other than two and may be of different type, for example may be formed by transconductance elements or may be of passive type and formed by a network of inductors and capacitors.

With reference back to FIGS. 1 and 2, the quantizer 43 receives the filtered signal $S_f$ and the correction clock signal $CK_{FS}$.

The quantizer 43, for example having a single-bit or multibit architecture, e.g., of FLASH type or of the Successive Approximation Register (SAR) type, generates a fine capacitance signal $N_C$, discrete, as a function of the value of the filtered signal $S_f$, with a frequency equal to the frequency $f_{FS}$ of the correction clock signal $CK_{FS}$.

According to an embodiment, the quantizer 43 may be configured to compare the value of the filtered signal $S_f$ with a threshold value Vth, at each event, for example a rising or falling edge, of the correction clock signal $CK_{FS}$.

For example, the threshold value Vth may be equal to zero and if the filtered signal $S_f$, in modulus, is greater than the threshold value Vth, then the quantizer 43 may increase (or decrease) the value of the fine capacitance signal $N_C$ by one unit.

For example, the quantizer 43 may generate the fine capacitance signal $N_C$ so that the fine capacitance signal $N_C$ is equal to the numerical value, e.g., in binary format, of the ratio between the filtered signal $S_f$ and a conversion reference signal, for example equal to the threshold value Vth.

However, the quantizer 43 may be configured to modify the value of the fine capacitance signal $N_C$ in a different manner, for example by using a non-binary coding code, for example, of thermometric type.

Additionally or alternatively, the quantizer 43 may be configured to have a dithering function on the fine capacitance signal $N_C$.

In operation, the quantizer 43 updates the value of the fine capacitance signal $N_C$ with a frequency equal to the frequency $f_{FS}$ of the correction clock signal $CK_{FS}$.

In some embodiments, the quantizer 43 further provides a fine sign signal $s_C$, indicative of the sign of the filtered signal $S_f$ and therefore of the demodulated quadrature signal $S_{Q\text{-}DEM}$. In operation, the fine sign signal $s_C$ indicates the phase-shift sign of the quadrature component of the sensing signal $S_S$ with respect to the position signal $S_R$, e.g., whether the quadrature component of the sensing signal $S_S$ is phase-shifted by 0° or by 180° with respect to the position signal $S_R$.

The correction modulator 45 receives the fine capacitance signal $N_C$ and the position signal $S_R$, and generates the cancellation signal $S_{canc}$.

In this embodiment, the correction modulator 45 comprises a first variable capacitor 60, whose capacitance value is controlled by the fine capacitance signal $N_C$. For example, the first variable capacitor 60 may be formed by a plurality of parallel-coupled capacitive modules, each of which may be activated or deactivated as a function of the value indicated by the fine capacitance signal $N_C$.

The correction modulator 45 further comprises a first phase shifter 63, receiving the position signal $S_R$ and the fine sign signal $s_C$, and an attenuator 65 coupled to an output of the first phase shifter 63.

The first phase shifter 63 provides a phase-shifted signal $S_{dp}$ to the attenuator 65. The phase-shifted signal $S_{dp}$ is equal to the position signal $S_R$ or to the position signal $S_R$ with a phase shift, for example, a phase-shift of 180°, as a function of the sign value indicated by the fine sign signal $s_C$.

The attenuator 65 attenuates the phase-shifted signal $S_{dp}$ generating a fine cancellation voltage $V_{CANC-C}$.

The first variable capacitor 60 has a first terminal 61 coupled to the input adder node 17 and a second terminal 62 coupled to the output of the attenuator 65, i.e., to the fine cancellation voltage $V_{CANC-C}$.

In this embodiment, the correction modulator 45 further comprises a register 68, a second variable capacitor 70 and a second phase shifter 72.

The register 68 provides the second variable capacitor 70 with a coarse capacitance signal $N_H$ that is configured to set the capacitance value of the second variable capacitor 70.

For example, the second variable capacitor 70 may be formed by a plurality of parallel-coupled capacitive modules, each of which may be activated or deactivated as a function of the value indicated by the coarse capacitance signal $N_H$.

The value of the coarse capacitance signal $N_H$ may be determined during an initial calibration step of the MEMS gyroscope 1 and/or may be modified in case of subsequent calibration steps of the MEMS gyroscope 1.

The register 68 further provides a coarse sign signal $S_H$ to the second phase shifter 72, indicative of an initial sign of the phase-shift between the quadrature component of the sensing signal $S_S$ and the position signal $S_R$, measured in the initial calibration step.

The second phase shifter 72 receives the position signal $S_R$ and provides a coarse cancellation voltage $V_{CANC-H}$. The coarse cancellation voltage $V_{CANC-H}$ is equal to the position signal $S_R$ or to the position signal $S_R$ with a phase shift, for example a phase shift of 180°, as a function of the sign value indicated by the coarse sign signal $S_H$.

The second variable capacitor 70 has a first terminal 71 coupled to the input adder node 17 and a second terminal 72 coupled to the output of the second phase shifter 72, i.e., to the coarse cancellation voltage $V_{CANC-H}$.

In operation, the driving signal $S_D$ causes an oscillation of the driving structure 8 along the driving direction, e.g., the first axis X. In the presence of a rotation of the MEMS gyroscope 1 about an axis transverse to the driving direction, e.g., about the third axis Z, the movable structure 6 undergoes a displacement along the sensing direction, parallel to the second axis Y in the considered example. The movement of the movable structure 6 modifies the capacitance value $C_{MEMS}$ of the sensing capacitor 13. As a result, the sensing capacitor 13 generates a measurement current $I_{Cor}$, indicative of the rotation of the MEMS gyroscope 1.

Due to manufacturing imperfections of the oscillating system 3, the driving signal $S_D$ may cause a spurious movement of the movable structure 6 along the sensing direction even in the absence of rotations of the MEMS gyroscope 1. The spurious movement may be sensed by the sensing capacitor 13, which therefore also generates a quadrature current $I_Q$ which adds to the measurement current $I_{Cor}$.

The quadrature current $I_Q$ is phase-shifted with respect to the measurement current $I_{Cor}$, for example phase-shifted by 90°, thus introducing a quadrature component in the measurement signal $S_M$.

The correction signal $S_{CANC}$ here comprises a cancellation current $I_{CANC}$ generated by the first and the second variable capacitors 60, 70 from the reference signal, here the position signal $S_R$. In detail, the capacitance of the fine variable capacitor 60 and of the coarse variable capacitor 70 cause the cancellation current $I_{CANC}$ to have an amplitude that is equal, in modulus, to the quadrature current $I_Q$, as shown in the graph of FIG. 4, wherein the quadrature current $I_Q$ is indicated by a dashed line.

Figure 4:
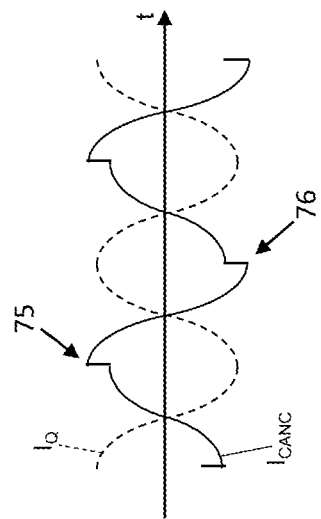
FIG. 4 shows a plot of a trend over time of waveforms of the MEMS gyroscope of FIG. 2.

Furthermore, the first and the second phase shifters 63, 72 cause the cancellation current $I_{CANC}$ to have an opposite sign or direction with respect to the quadrature current $I_Q$, as again shown in FIG. 4.

In operation, the cancellation current $I_{CANC}$ cancels the quadrature current $I_Q$; therefore, the amplifier 23 receives and amplifies, as a first approximation, only the component of the measurement signal $S_M$ given by the rotation of the MEMS gyroscope 1.

The fact that the capacitance of the fine variable capacitor 60 is updated, in operation, at the frequency $f_{FS}$ of the correction clock signal $CK_{FS}$, causes a possible noise introduced by the quantization of the filtered signal $S_f$ to be at a frequency which is outside the band of interest BW of the demodulated sensing signal $S_{S-DEM}$ that is used to sense the rotation of the MEMS gyroscope 1.

The frequency $f_{FS}$ of the correction clock signal $CK_{FS}$ may be greater than the maximum frequency of the frequency band of interest BW.

For example, the frequency $f_{FS}$ of the correction clock signal $CK_{FS}$ may be greater than the output frequency $f_o$ of the output signal $S_O$.

In operation, the correction module 37, for example the fine variable capacitor 60, allows the correction signal $S_{CANC}$ to be modulated in an adaptive manner, so as to compensate for variations in the quadrature current $I_Q$, when using the MEMS gyroscope 1, without introducing noise in the frequency band of interest BW. The MEMS gyroscope 1 is therefore able to effectively compensate for variations in the quadrature error component of the measurement signal $S_M$, without compromising the sensing sensitivity of a rotation of the MEMS gyroscope 1.

According to an embodiment, as shown for example in FIG. 4, the cancellation current $I_{CANC}$ is updated in update time instants 75, 76, corresponding respectively to peaks and valleys of the cancellation current $I_{CANC}$.

The peaks and valleys of the cancellation current $I_{CANC}$ correspond to the instants when the coarse cancellation voltage $V_{CANC-C}$ has maximum slope, i.e., when it crosses the zero value. In practice, the correction clock signal $CK_{FS}$ is synchronized with the zero crossings of the position signal $S_R$.

In this manner, the capacitance variation of the first variable capacitor 60 occurs when the voltage across the first variable capacitor 60 has the value zero, thus avoiding the occurrence of peak currents associated with the charging and discharging of the first variable capacitor 60 during the updating of the respective capacitance value, which might compromise the performances of the MEMS gyroscope 1.

For example, if the frequency $f_{FS}$ of the correction clock signal $CK_{FS}$ is equal to double the driving frequency $f_D$, as shown in FIG. 4, the update frequency of the coarse capacitance signal $N_C$ and therefore of the cancellation current $I_{CANC}$ may be maximized.

Figure 5:
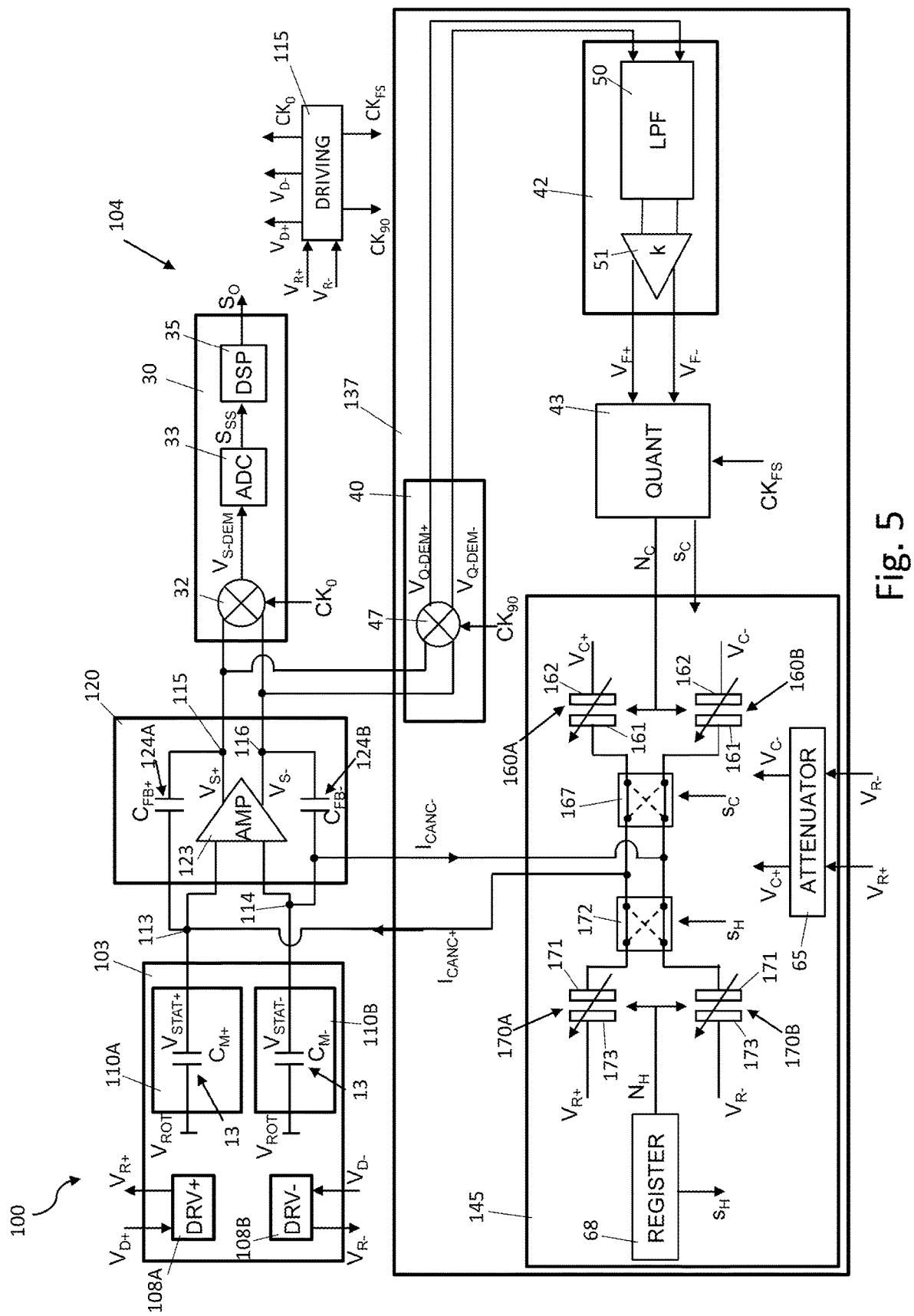
FIG. 5 shows a block diagram of the present MEMS gyroscope, according to a different embodiment.

FIG. 5 shows a different embodiment of the present MEMS gyroscope, here indicated by 100. The MEMS gyroscope 100 has a general structure similar to that of the MEMS gyroscope 1; accordingly, elements in common are indicated by the same reference numerals and are not further described.

The MEMS gyroscope 100 has a differential architecture and is formed here again by an oscillating system, here indicated by 103, and comprising a movable structure, not shown here, a first and a second driving structure 108A, 108B, and a first and a second sensing structure 110A, 110B, and by a control circuit, here indicated by 104.

The first and the second sensing structures 110A, 110B are equal to the sensing structure 10 of the MEMS gyroscope 1. In detail, the first sensing structure 110A forms a sensing capacitor 13 having capacitance $C_{M+}$ and whose terminals are at a rotor voltage $V_{ROT}$ and at a positive stator voltage $V_{STAT+}$, respectively.

The second sensing structure 110B forms a sensing capacitor 13 having capacitance $C_{M-}$ and whose terminals are at the rotor voltage $V_{ROT}$ and at a negative stator voltage $V_{STAT-}$, respectively.

In practice, the first and the second sensing structures 110A, 110B are configured to sense, in a differential manner, a movement of the movable structure along the sensing direction.

The first and the second driving structures 108A, 108B are each equal to the driving structure 8 of the MEMS gyroscope 1. In this embodiment, the first driving structure 108A receives a driving signal, here a positive driving voltage $V_{D+}$, and generates a position signal, here a positive position voltage $V_{R+}$, and the second driving structure 108B receives a driving signal, here a negative driving voltage $V_{D-}$, and generates a position signal, here a negative position voltage $V_{R-}$.

In operation, the first and the second driving structures 108A, 108B are configured to drive the movable structure and sense the movement of the movable structure along the driving direction, in a differential manner.

The control circuit 104 comprises a sensing circuitry, here indicated by 120, the signal processing module 30, a driving module, here indicated by 115, and a correction module, here indicated by 137.

The driving module 115 generates the positive driving voltage $V_{D+}$ and the negative driving voltage $V_{D-}$, mutually phase-shifted by 180°, each having the driving frequency $f_D$.

The driving module 115 receives the positive position voltage $V_{R+}$ and the negative position voltage $V_{R-}$ and generates here again the in-phase clock signal $CK_0$, the out-of-phase clock signal $CK_{90}$ and the correction clock signal $CK_{FS}$.

The in-phase clock signal $CK_0$ is in quadrature with a difference signal $V_{R+}-V_{R-}$ given by the difference between the positive position voltage $V_{R+}$ and the negative position voltage $V_{R-}$.

In detail, the rising (or falling) edges of the in-phase clock signal $CK_0$ are synchronized with the peaks (or valleys) of the difference signal $V_{R+}-V_{R-}$. The rising (or falling) edges of the out-of-phase clock signal $CK_{90}$ are synchronized with the zero crossings of the difference signal $V_{R+}-V_{R-}$.

The sensing circuitry 120 comprises an amplifier 123, of differential type, having two inputs, of which a positive input 113 and a negative input 114, and two outputs, of which a negative output 115 and a positive output 116.

The positive input 113 is coupled to the terminal of the first sensing structure 110A at the positive stator voltage $V_{STAT+}$, and the negative input 114 is coupled to the terminal of the second sensing structure 110B at the negative stator voltage $V_{STAT-}$.

The sensing circuitry 120 further comprises a first feedback capacitor 124A, having capacitance $C_{FB+}$ and coupled between the positive input 113 and the negative output 115 of the amplifier 123, and a second feedback capacitor 124B, having capacitance $C_{FB-}$ and coupled between the negative input 114 and the positive output 116 of the amplifier 123.

The negative output 115 and the positive output 116 of the amplifier 123 are respectively at a positive sensing voltage $V_{S+}$ and at a negative sensing voltage $V_{S-}$.

In this embodiment, the signal processing module 30 receives the positive sensing voltage $V_{S+}$ and the negative sensing voltage $V_{S-}$. The demodulator 32 demodulates the positive sensing voltage $V_{S+}$ and the negative sensing voltage $V_{S-}$ using the in-phase clock signal $CK_0$ and generates the demodulated sensing signal, herein indicated by $V_{S-DEM}$.

The analog-to-digital converter 33 and the digital processor 35 generate, from the demodulated sensing signal $V_{S-DEM}$, the output signal $S_O$ at the output frequency $f_o$, as described above for the MEMS gyroscope 1.

The correction module 137 comprises the quadrature demodulator 40 including the demodulator 47, the filtering stage 42 including the filter 50 and the amplifier 51, the quantizer 43 and the correction modulator, here indicated by 145.

The demodulator 47 receives and demodulates the positive sensing voltage $V_{S+}$ and the negative sensing voltage $V_{S-}$ using the out-of-phase clock signal $CK_{90}$, from which it generates a positive demodulated quadrature voltage $V_{Q-DEM+}$ and a negative demodulated quadrature voltage $V_{Q-DEM-}$, respectively.

The filtering stage 42 receives the positive demodulated quadrature voltage $V_{Q-DEM+}$ and the negative demodulated quadrature voltage $V_{Q-DEM-}$, from which it generates a positive filtered voltage $V_{f+}$ and a negative filtered voltage $V_{f-}$, respectively.

The quantizer 43 receives the positive filtered voltage $V_{f+}$ and the negative filtered voltage $V_{f-}$ and provides the fine capacitance signal $N_C$.

In some embodiments, the value of the fine capacitance signal $N_C$ is updated at the frequency $f_{FS}$ of the correction clock signal $CK_{FS}$ and depends on the difference between the positive filtered voltage $V_{f+}$ and the negative filtered voltage $V_{f-}$, for example with respect to a threshold voltage, which may be determined during the calibration step.

Also here, the quantizer 43 provides the fine sign signal $s_C$, indicative of the sign of the difference between the positive filtered voltage $V_{f+}$ and the negative filtered voltage $V_{f-}$.

The correction module 145 comprises the attenuator 65, a first and a second fine variable capacitor 160A, 160B, equal to each other, and a first signal switch or deviator 167.

The attenuator 65 receives and attenuates the positive position voltage $V_{R+}$ and the negative position voltage $V_{R-}$, from which it generates a positive cancellation voltage $V_{C+}$ and a negative cancellation voltage $V_{C-}$, respectively.

The first and the second fine variable capacitors 160A, 160B receive the fine capacitance signal $N_C$, which controls the capacitance value thereof. For example, the first and the second fine variable capacitors 160A, 160B may each be formed by a plurality of capacitive modules mutually coupled in parallel which may be activated or deactivated as a function of the value indicated by the fine capacitance signal $N_C$.

The first and the second fine variable capacitors 160A, 160B each have a first terminal 161 coupled to a respective input of the first deviator 167, and a second terminal 162 to the positive cancellation voltage $V_{C+}$ and, respectively, to the negative cancellation voltage $V_{C-}$.

The first deviator 167 is controlled by the fine sign signal $s_C$ and has a first output coupled to the positive input 113 of the amplifier 123 and a second output coupled to the negative input 114 of the amplifier 123.

For example, when the fine sign signal $s_C$ indicates a negative sign, the first deviator 167 couples (as indicated in FIG. 5 by the dashed lines inside the first deviator 167) the first fine variable capacitor 160A to the negative input 114 of the amplifier 123 and the second fine variable capacitor 160B to the positive input 113 of the amplifier 123.

Conversely, when the fine sign signal $s_C$ indicates a positive sign, the first deviator 167 couples (as indicated in FIG. 5 by the solid lines inside the first deviator 167) the first fine variable capacitor 160A to the positive input 113 of the amplifier 123 and the second fine variable capacitor 160B to the negative input 114 of the amplifier 123.

The modulation block 145 further comprises the register 68, which stores the coarse capacitance signal $N_H$ and the coarse sign signal $S_H$, a first and a second coarse variable capacitor 170A, 170B, and a second deviator 172.

The first and the second coarse variable capacitors 170A, 170B receive the coarse capacitance signal $N_H$, which controls the capacitance value thereof. For example, the first and the second coarse variable capacitors 170A, 170B may each be formed by a plurality of capacitive modules mutually coupled in parallel which may be activated or deactivated as a function of the value indicated by the coarse capacitance signal $N_H$.

The first and the second coarse variable capacitors 170A, 170B each have a first terminal 171 coupled to a respective input of the second deviator 172, and a second terminal 173 to the positive position voltage $V_{R+}$ and, respectively, to the negative position voltage $V_{R-}$.

The second deviator 172 is controlled by the coarse sign signal $S_H$ and has a first output coupled to the positive input 113 of the amplifier 123 and a second output coupled to the negative input 114 of the amplifier 123.

For example, when the coarse sign signal $S_H$ indicates a negative sign, the second deviator 172 couples the first coarse variable capacitor 170A to the negative input 114 of the amplifier 123 and the second coarse variable capacitor 170B to the positive input 113 of the amplifier 123, as indicated in FIG. 5 by the dashed lines inside the second deviator 172.

Conversely, when the coarse sign signal $S_H$ indicates a positive sign, the second deviator 172 couples the first coarse variable capacitor 170A to the positive input 113 of the amplifier 123 and the second coarse variable capacitor 170B to the negative input 114 of the amplifier 123, as indicated in FIG. 5 by the solid lines inside the second deviator 172.

In operation, the correction modulator 145 allows a positive cancellation current $I_{CANC+}$ and a negative cancellation current $I_{CANC-}$ to be generated, in a manner similar to what has been discussed above for the correction modulator 45 of the MEMS gyroscope 1. The positive cancellation current $I_{CANC+}$ and the negative cancellation current $I_{CANC-}$ cancel any quadrature component generated by the sensing capacitors 13 of the first and the second sensing structures 110A, 110B.

At the input of the amplifier 123, the quadrature components of the measurement signal $S_M$ are thus compensated. The output signal $S_O$ of the MEMS gyroscope 100 is not affected by the quadrature error and the MEMS gyroscope 100 has a high sensing sensitivity.

Furthermore, in this embodiment, the first and the second deviators 167, 172 allow, in use, the sign of the cancellation signal $S_{CANC}$, here obtained in a differential manner from the positive cancellation current $I_{CANC+}$ and from the negative cancellation current $I_{CANC-}$, to be inverted.

Finally, it is clear that modifications and variations may be made to the MEMS gyroscope 1, 100 described and illustrated herein without thereby departing from the scope of the present disclosure, as defined in the attached claims.

The coarse variable capacitor 70 and/or the first and the second coarse variable capacitors 170A, 170B may also be controlled by a respective capacitance signal generated by a respective quantizer.

Alternatively or additionally, the correction modulator 45 may be formed by a single modulation group comprising the fine variable capacitor 60 and the first phase shifter 63. Similarly, the correction modulator 145 may be formed by a single modulation group comprising the first and the second fine variable capacitors 160A, 160B and the first deviator 167.

For example, in the MEMS gyroscope 1 of FIG. 2, the mutual arrangement of the attenuator 65 and the first phase shifter 63 may be inverted.

Furthermore, for example, in the correction modulators 45, 145, the cancellation signals $I_{CANC}$, $I_{CANC+}$, $I_{CANC-}$ may be generated directly from the respective position signals $S_R$, $V_{R+}$, $V_{R-}$, i.e., without the position signals being subject to attenuation.

The correction modulators 45, 145 may be configured to generate the cancellation signal $S_{CANC}$ in a different manner.

For example, with reference to the modulation block 45 of the MEMS gyroscope 1, the cancellation current $I_{CANC}$ may be obtained by maintaining the fine cancellation voltage $V_{CANC-C}$ constant over time and varying the capacitance of the fine variable capacitor 60 at the driving frequency over time.

For example, the control circuit 4 may comprise an analog-to-digital converter so that the quadrature demodulator 40 and/or the filtering stage 42 may be implemented using a digital architecture, rather than an analog architecture.

For example, the MEMS gyroscope 1, 100 may be of monoaxial, biaxial or triaxial type.

For example, the movable structure 6 may comprise one or more movable masses, according to the specific application of the MEMS gyroscope 1, 100. In case the movable structure 6 comprises a plurality of movable masses, the MEMS gyroscope 1, 100 may comprise a plurality of driving structures, for example one for each movable mass. Alternatively, the MEMS gyroscope 1, 100 may comprise a single driving structure coupled to a movable driving mass and the remaining movable masses may be suitably elastically coupled to the movable driving mass.

Finally, the described embodiments may be combined to form further solutions.

A control circuit (4; 104) for a MEMS gyroscope (1; 100), configured to receive a measurement signal ($S_M$) having a quadrature component ($I_Q$) and a sensing component ($I_{Cor}$) from the MEMS gyroscope, the control circuit may be summarized as including an input stage (17, 20; 113, 114, 120) configured to acquire an input signal ($S_M+S_{CANC}$) and to generate an acquisition signal ($S_S$; $V_{S+}$, $V_{S-}$) in response to the acquisition of the input signal, the input signal being a function of the measurement signal and of a quadrature cancellation signal ($S_{CANC}$, $I_{CANC}$; $I_{CANC+}$, $I_{CANC-}$); a processing stage (30) configured to extract a first component ($S_{S-DEM}$; $V_{S-DEM}$) of the acquisition signal ($S_S$; $V_{S+}$, $V_{S-}$), the first component of the acquisition signal being indicative of the sensing component of the measurement signal and having a sensing frequency band; and a quadrature correction stage (37; 137) configured to extract a second component ($S_{Q-DEM}$; $V_{Q-DEM+}$, $V_{Q-DEM-}$) of the acquisition signal ($S_S$; $V_{S+}$, $V_{S-}$), the second component of the acquisition signal being indicative of the quadrature component of the measurement signal, and to generate the quadrature cancellation signal ($S_{CANC}$, $I_{CANC}$; $I_{CANC+}$, $I_{CANC-}$) from a reference signal ($S_R$, $V_{CANC-C}$; $V_{C+}$, $V_{C-}$), wherein the quadrature cancellation signal is a signal modulated as a function of the second component of the acquisition signal, at an update frequency ($f_{FS}$) which is outside the sensing frequency band.

The quadrature correction stage may be a sigma-delta modulator.

The quadrature correction stage (37; 137) may include a filtering stage (42) configured to filter the second component ($S_{Q-DEM}$; $V_{Q-DEM+}$, $V_{Q-DEM-}$) of the acquisition signal ($S_S$; $V_{S+}$, $V_{S-}$), generating a filtered signal ($S_f$; $V_{F+}$, $V_{F-}$); a quantizer (43) configured to receive an update clock signal ($CK_{FS}$) having the update frequency ($f_{FS}$) and to generate a digital correction signal ($N_C$, $S_C$), from the filtered signal, having a data rate equal to the update frequency; and a modulator (45; 145) configured to generate the quadrature cancellation signal ($S_{CANC}$, $I_{CANC}$; $I_{CANC+}$, $I_{CANC-}$), modulating the amplitude and/or phase thereof as a function of the digital correction signal, so as to cancel the quadrature component ($I_Q$) of the measurement signal in the input signal ($S_M$+$S_{CANC}$).

The input stage (20; 120) may have an input node (17; 113, 114) configured to receive the measurement signal, the modulator may include a first variable capacitor (60; 160A, 160B) having a first terminal (61; 162) coupled to the input node of the input stage and a second terminal (62; 161) configured to receive an input voltage ($V_{CANC-C}$; $V_{C+}$, $V_{C-}$) that is a function of the reference signal, the digital correction signal ($N_C$) being configured to modify the capacitance of the first variable capacitor and modulate the amplitude of the quadrature cancellation signal.

The correction signal may include a sign signal ($S_C$) indicative of a phase-shift sign of the filtered signal ($S_f$), the modulator further including a phase-shift block (63; 167) configured to invert the phase of the quadrature cancellation signal ($S_{CANC}$, $I_{CANC}$; $I_{CANC+}$, $I_{CANC-}$) as a function of the sign signal.

The update clock signal ($CK_{FS}$) may be synchronized with the zero crossings of the reference signal ($S_R$; $V_{R+}$, $V_{R-}$).

The reference signal may have a first frequency ($f_D$) and the update frequency ($f_{FS}$) may be equal to double the first frequency.

The control circuit configured to receive the reference signal ($S_R$; $V_{R+}$, $V_{R-}$) from an oscillating system (3; 103) of the MEMS gyroscope, the control circuit may further include a driving module (15; 115) configured to generate a driving signal ($S_D$, $V_{D+}$, $V_{D-}$) having a first frequency ($f_D$) and configured to cause a driving oscillation of the oscillating system (3; 103), the reference signal being indicative of the driving oscillation of the oscillating system.

The driving module may be configured to generate a first demodulating signal ($CK_0$) having the first frequency and in quadrature with respect to the reference signal, a second demodulating signal ($CK_{90}$) having the first frequency and in-phase with respect to the reference signal, the processing stage (30) being configured to extract the first component of the acquisition signal using the first demodulating signal, the quadrature correction stage (37; 137) being configured to extract the second component of the acquisition signal using the second demodulating signal.

The modulator may further include a second variable capacitor (70; 170A, 170B) and a register (68), the second variable capacitor having a first terminal (71; 173) coupled to the input node (17; 113, 114) of the input stage (20; 120) and a second terminal (72; 171) configured to receive a second input voltage ($V_{CANC-H}$; $V_{R+}$, $V_{R-}$) that is a function of the reference signal, the register (68) being configured to generate a calibration correction signal ($N_H$, $S_H$), the calibration correction signal ($N_C$) being configured to set a calibration capacitance value of the second variable capacitor.

The input stage (120) may have a first input (113) and a second input (114) and may be configured to receive a measurement signal of differential type from the MEMS gyroscope and a quadrature cancellation signal ($I_{CANC+}$, $I_{CANC-}$) of differential type from the quadrature correction stage (137).

A MEMS gyroscope (1; 100) may be summarized as including a control circuit (4; 104) according to any of the preceding claims and an oscillating system (3; 103) configured to generate the measurement signal ($S_M$).

A control method for a MEMS gyroscope (1; 100) may be summarized as including a control circuit (4; 104), the control method comprising, by the control circuit: receiving a measurement signal ($S_M$) having a quadrature component ($I_Q$) and a sensing component ($I_{Cor}$) from the MEMS gyroscope; acquiring an input signal ($S_M$+$S_{CANC}$), the input signal being a function of the measurement signal and of a quadrature cancellation signal ($S_{CANC}$, $I_{CANC}$; $I_{CANC+}$, $I_{CANC-}$); generating an acquisition signal ($S_S$; $V_{S+}$, $V_{S-}$) in response to the acquisition of the input signal; extracting a first component ($S_{S-DEM}$; $V_{S-DEM}$) of the acquisition signal ($S_S$; $V_{S+}$, $V_{S-}$) indicative of the sensing component of the measurement signal, the first component of the acquisition signal having a sensing frequency band; extracting a second component ($S_{Q-DEM}$; $V_{Q-DEM+}$, $V_{Q-DEM-}$) of the acquisition signal ($S_S$; $V_{S+}$, $V_{S-}$) indicative of the quadrature component of the measurement signal; and generating the quadrature cancellation signal ($S_{CANC}$, $I_{CANC}$; $I_{CANC+}$, $I_{CANC-}$) from a reference signal ($S_R$, $V_{CANC-C}$; $V_{C+}$, $V_{C-}$), wherein the quadrature cancellation signal is a signal modulated as a function of the second component of the acquisition signal, at an update frequency ($f_{FS}$) which is outside the sensing frequency band.

Generating the quadrature cancellation signal may include filtering the second component of the acquisition signal, generating a filtered signal ($S_f$, $V_{F+}$, $V_{F-}$); generating, from the filtered signal and by a quantizer (43) controlled by an update clock signal ($CK_{FS}$) having the update frequency, a digital correction signal ($N_C$, $S_C$) having a data rate equal to the update frequency; and modulating amplitude and/or phase of the quadrature cancellation signal as a function of the digital correction signal, to cancel the quadrature component ($I_Q$) of the measurement signal in the input signal ($S_M$+$S_{CANC}$).

The update clock signal may be synchronized with the zero crossings of the reference signal ($S_R$, $V_{R+}$, $V_{R-}$).

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A control circuit for a MEMS gyroscope, configured to receive a measurement signal having a quadrature component and a sensing component from the MEMS gyroscope, the control circuit comprising:
    an input stage configured to acquire an input signal and to generate an acquisition signal in response to the input signal, the input signal being a function of the measurement signal and of a quadrature cancellation signal;
    a processing stage configured to obtain a first component of the acquisition signal, the first component of the acquisition signal being indicative of the sensing component of the measurement signal and having a sensing frequency band; and
    a quadrature correction stage configured to extract a second component of the acquisition signal and to generate the quadrature cancellation signal based on a reference signal, the second component of the acquisition signal being indicative of the quadrature component of the measurement signal,
    wherein the quadrature cancellation signal is a signal modulated as a function of the second component of the acquisition signal, at an update frequency which is outside the sensing frequency band.

2. The control circuit according to claim 1, wherein the quadrature correction stage is a sigma-delta modulator.

3. The control circuit according to claim 1, wherein the quadrature correction stage comprises:
    a filtering stage configured to filter the second component of the acquisition signal to generate a filtered signal;
    a quantizer configured to receive an update clock signal having the update frequency and to generate, based on the filtered signal, a digital correction signal having a data rate equal to the update frequency; and
    a modulator configured to modulate one or more of an amplitude or a phase of the quadrature cancellation signal based on the digital correction signal.

4. The control circuit according to claim 3, wherein the input stage has an input node configured to receive the measurement signal, and
    wherein the modulator comprises a first variable capacitor having a first terminal coupled to the input node of the input stage and a second terminal configured to receive an input voltage that is a function of the reference signal, the digital correction signal being configured to modify the capacitance of the first variable capacitor to modulate the amplitude of the quadrature cancellation signal.

5. The control circuit according to claim 3, wherein the digital correction signal comprises a sign signal indicative of a phase-shift sign of the filtered signal, and
    wherein the modulator further comprises a phase-shift block configured to invert the phase of the quadrature cancellation signal as a function of the sign signal.

6. The control circuit according to claim 3, wherein the update clock signal is synchronized with zero crossings of the reference signal.

7. The control circuit according to claim 1, wherein the reference signal has a first frequency and the update frequency is equal to about two times the first frequency.

8. The control circuit according to claim 1, configured to receive the reference signal from an oscillating system of the MEMS gyroscope,
    wherein the control circuit further comprises a driving module configured to generate a driving signal having a first frequency and configured to cause a driving oscillation of the oscillating system, the reference signal being indicative of a driving oscillation of the oscillating system.

9. The control circuit according to claim 8, wherein the driving module is configured to generate a first demodulating signal having the first frequency and in quadrature with respect to the reference signal, a second demodulating signal having the first frequency and in-phase with respect to the reference signal, the processing stage being configured to extract the first component of the acquisition signal using the first demodulating signal, the quadrature correction stage being configured to extract the second component of the acquisition signal using the second demodulating signal.

10. The control circuit according to claim 4, wherein the modulator further comprises a second variable capacitor and a register, the second variable capacitor having a first terminal coupled to the input node of the input stage and a second terminal configured to receive a second input voltage that is a function of the reference signal, the register being configured to generate a calibration correction signal, the calibration correction signal being configured to set a calibration capacitance value of the second variable capacitor.

11. The control circuit according to claim 1, having a differential architecture, wherein the input stage has a first input and a second input and is configured to receive a measurement signal of differential type from the MEMS gyroscope and a quadrature cancellation signal of differential type from the quadrature correction stage.

12. A control method for a MEMS gyroscope comprising a control circuit, the control method comprising, by the control circuit:
    receiving a measurement signal having a quadrature component and a sensing component from the MEMS gyroscope;
    acquiring an input signal, the input signal being a function of the measurement signal and of a quadrature cancellation signal;
    generating an acquisition signal in response to the acquisition of the input signal;
    extracting a first component of the acquisition signal indicative of the sensing component of the measurement signal, the first component of the acquisition signal having a sensing frequency band;
    extracting a second component of the acquisition signal indicative of the quadrature component of the measurement signal; and
    generating the quadrature cancellation signal from a reference signal,
    wherein the quadrature cancellation signal is a signal modulated based on the second component of the acquisition signal, at an update frequency which is outside the sensing frequency band.

13. The control method according to claim 12, wherein generating the quadrature cancellation signal comprises:
    filtering the second component of the acquisition signal to generate a filtered signal;
    generating, from the filtered signal and by a quantizer controlled by an update clock signal having the update frequency, a digital correction signal having a data rate equal to the update frequency; and
    modulating one or more of an amplitude lor a phase of the quadrature cancellation signal based on the digital correction signal, the quadrature cancellation signal configured to cancel the quadrature component of the measurement signal in the input signal.

14. The control method according to claim 13, wherein the update clock signal is synchronized with zero crossings of the reference signal.

15. A MEMS gyroscope having a control circuit and an oscillating system, the control circuit comprising:
a quadrature correction stage configured to generate a quadrature cancellation signal based on a reference signal and a quadrature component of a measurement signal of the oscillating system, the quadrature cancellation signal configured to cancel the quadrature component of the measurement signal,
wherein the quadrature correction stage includes a first phase shifter and a first variable capacitor, the first variable capacitor coupled to an output of the first phase shifter and configured to vary a capacitance value of the first variable capacitor based on the calibration correction signal.

16. The MEMS gyroscope of claim 15, wherein the quadrature correction stage includes a second phase shifter configured to modulate a phase of the reference signal based on the quadrature component of the measurement signal.

17. The MEMS gyroscope of claim 15, wherein the quadrature correction stage includes a second variable capacitor that varies a capacitance based on the quadrature component of the measurement signal.

18. The MEMS gyroscope of claim 17, wherein the second variable capacitor is coupled to receive a signal generated based on the reference signal.

19. The MEMS gyroscope of claim 15, wherein the quadrature correction stage is configured to generate the quadrature cancellation signal based on the reference signal and the calibration correction signal.

20. The MEMS gyroscope of claim 19, wherein the first phase shifter is configured to modulate a phase of the reference signal based on the calibration correction signal.

* * * * *